United States Patent [19]

Glass et al.

[11] 4,273,610

[45] Jun. 16, 1981

[54] METHOD FOR CONTROLLING THE RESONANCE FREQUENCY OF YTTRIUM IRON GARNET FILMS

[75] Inventors: Howard L. Glass, Orange; Michael T. Elliott, Cypress, both of Calif.

[73] Assignee: The United States of America as represented by the Secretary of the Air Force, Washington, D.C.

[21] Appl. No.: 74,263

[22] Filed: Sep. 11, 1979

[51] Int. Cl.$^3$ .............................................. B32B 0/00
[52] U.S. Cl. .......................... 156/624; 156/DIG. 63
[58] Field of Search ....... 156/624, DIG. 63, DIG. 73, 156/DIG. 85; 148/171, 1.5

[56] References Cited

U.S. PATENT DOCUMENTS 3,386,799   6/1968   Grodkiewicz et al. .
3,947,372   3/1976   Shinagawa et al. ............... 252/62.57

OTHER PUBLICATIONS

Glass, J. Crystal Growth 40 (1977) 205-213.
Davies et al., J. Crystal Growth 36 (1976) 191-197.
Owens et al. Ultrasonics Symposium Proceeding, IEEE Cat. #78CH1344-1SU, 684-688.
Tolksdorf et al., J. Crystal Growth 17 (1972) 322-328.
Damen et al., Mat. Res. Bull. 12 (1977) 73-78.
Henry et al., J. Appl. Phys. 47 (1976) 3702-3708.
Glass, J. Crystal Growth 33 (1976) 183-184.
Giess et al., J. Crystal Growth 16 (1972) p. 36-42.
Glass et al., J. Crystal Growth 27 (1974) p. 253-260.
Besser et al., Mat. Res. Bull 6 (1971) 1111-1123.
Erk, J. Crystal Growth 43 (1978) 446-456.
The Radio and Electronic Eng. V45 No. 12 738-748 12/75-Adam et al.

*Primary Examiner*—Hiram Bernstein
*Attorney, Agent, or Firm*—Donald J. Singer; William J. O'Brien

[57] ABSTRACT

A method for controlling the resonance frequency of single crystal yttrium iron garnet (YIG) films by incorporating lead as a partial substituent for the yttrium component of the YIG film.

1 Claim, 1 Drawing Figure

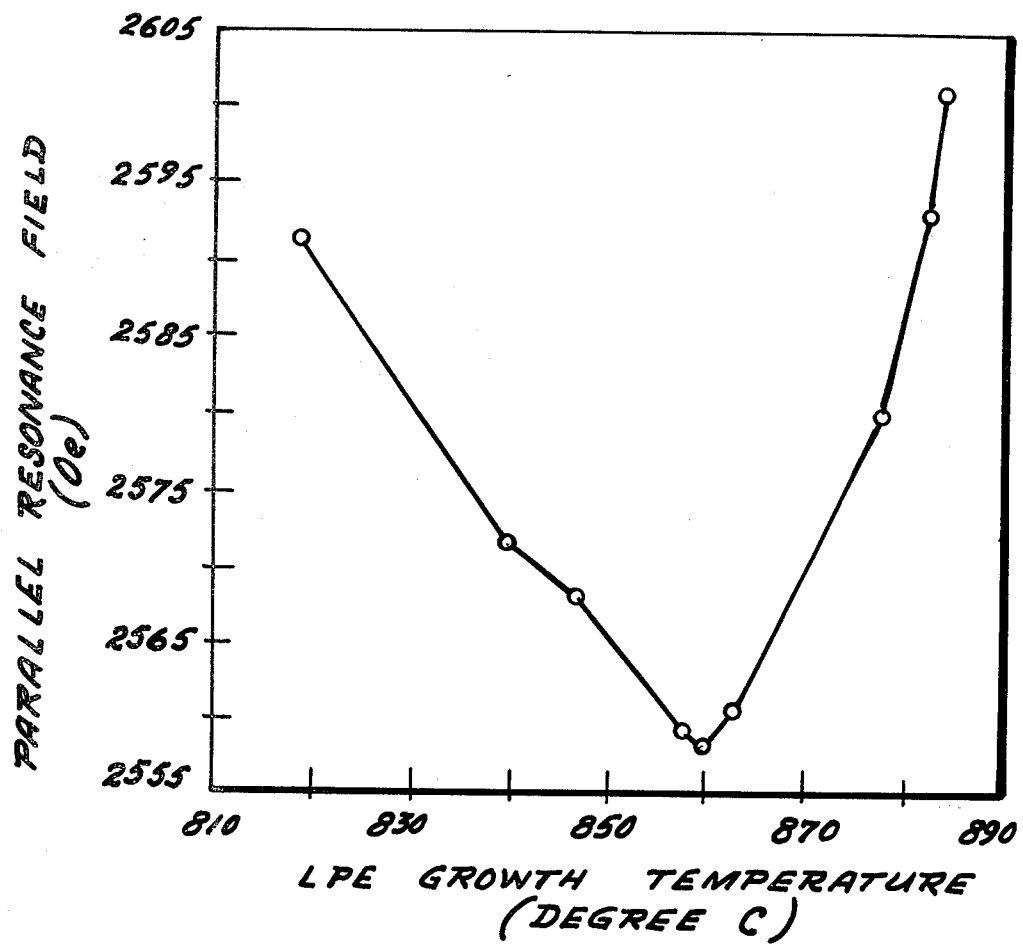

METHOD FOR CONTROLLING THE RESONANCE FREQUENCY OF YTTRIUM IRON GARNET FILMS

STATEMENT OF GOVERNMENT INTEREST

The invention described herein may be manufactured and used by or for the Government for governmental purposes without the payment of any royalty thereon.

BACKGROUND OF THE INVENTION

This invention relates to yttrium iron garnet films and to a method for their preparation. More particularly, this invention concerns itself with a method for controlling the resonance frequency of single crystal yttrium iron garnet (YIG) films grown by liquid phase epitaxy (LPE).

Single crystal yttrium iron garnet having the formula $Y_3Fe_5O_{12}$ and being hereinafter referred to as YIG, is an important crystalline material finding wide application for use in a variety of electronic devices. The material can be utilized in either its single crystal bulk form or as a single crystal film grown on a suitable substrate. In bulk form, the material is often used as an optical modulator, a magnetic flux sensor and in magneto-optical memory devices because of its faraday effect. The major interest in the film form is for applications in magnetic bubble domain devices and in microwave signal processing devices. The high quality of the film form, especially those grown by liquid phase epitaxy techniques (hereinafter referred to as LPE), suggests that thin films, on the order of 1 mm. in thickness, are superior to flux grown bulk crystals in the fabrication of garnet spheres which are used in a number of microwave devices.

In liquid phase epitaxy, the YIG films are grown on a suitable substrate by the isothermal dipping method using a $PbO$—$B_2O_3$ flux. The substrate is held horizontally in the flux and rotated around a vertical axis to produce the thin YIG films. However, it is often required to grow YIG films which have specific resonance frequencies or which have specific differences in resonance frequency in a fixed applied field. Heretofore, it has proven to be extremely difficult to control the resonance frequencies using liquid phase epitaxy. However, with the present invention, it has been found that the incorporation of several percent of lead as a substituent alters the lattice parameter of the YIG film thereby controlling the resonance frequency. The lead need not be added to the flux since it is already present. However, by growing the YIG at sufficiently low temperatures, the lead can be incorporated as a substituent for the Yttrium component of the YIG film in amounts as much as several weight percent.

Although the incorporation of lead as a substituent for YIG films is well known, its use as a means for controlling resonance frequency by utilizing a particular flux component in combination with specifically controlled growth temperatures, has not been previously recognized. The advantages of the present invention are that the flux of LPE melt is simple, the degree of lead incorporation is easily and effectively controlled, and a broad range of lead concentration can be prepared.

SUMMARY OF THE INVENTION

The present invention concerns itself with the liquid phase epitaxy (LPE) growth of single crystal thin films of yttrium iron garnet (YIG) and to the incorporation of lead as a substituent for the purpose of controlling the specific resonance frequency of the film. The YIG film is grown using a concentrated isothermal dipping technique. A gadolinium gallium garnet (GGG) substrate is held horizontally in a $PbO$—$B_2O_3$—$Fe_2O_3$—$Y_2O_3$—containing flux held at specifically controlled growing temperatures and the substrate is then rotated about a vertical axis to effect growth of the YIG as a thin film on the GGG crystalline substrate.

Accordingly, the primary object of this invention is to provide a method for controlling the resonance frequency of single crystal yttrium iron garnet films.

Another object of this invention is to provide a method for controlling the resonance frequency of an yttrium iron garnet film by incorporating lead as a substituent for yttrium.

Still another object of this invention is to provide a method for controlling the resonance frequency of liquid phase epitaxy grown YIG films which utilizes a simplified melt, effectively controls the degree of lead incorporation by controlling growth temperature, and provides a broad range of lead concentration at reasonable levels of misfit on a gadolinium gallium garnet substrate.

The above and still other objects and advantages of the present invention will become more readily discernable upon consideration of the following detailed description thereof when taken in conjunction with the accompanying drawing.

BRIEF DESCRIPTION OF THE DRAWING

In the drawing:

The FIGURE is a graphical illustration showing the variation of parallel resonance for a series of YIG film, grown at the specifically controlled growth temperature of this invention.

DETAILED DESCRIPTION OF THE PREFERRED EMBODIMENT

Pursuant to the above-defined objects, the present invention involves a method for controlling the resonance frequency of thin film of yttrium iron garnet (YIG) epitaxially grown on a gadolinium-gallium-garnet substrate (GGG).

Often times it is necessary that YIG films be characterized by having a specific resonance frequency or possess specific differences in resonance frequency in a fixed applied field.

The ferromagnetic resonance frequency for a disc is given by the following equation:

$$w/\gamma = H_o + H_A - 4\pi M \qquad (1)$$

or by $$(w/\gamma)^2 = H_o(H_o + 4\pi M - H_A) \qquad (2)$$

Equation (1) refers to perpendicular resonance where the applied magnetic field $H_o$ is normal to the plane of the disc. Equation (2) refers to parallel resonance with $H_o$ in the plane of the disc. $\gamma$ is the gyromagnetic ratio, $4\pi M$ is the spontaneous magnetization and $H_A$ is the anisotropy field. $w = 2\pi f$ where f is the resonance frequency.

It is well known that $4\pi M$ and $H_A$, and therefore W (for fixed $H_o$) can be systematically varied by substituting various chemical elements for yttrium and iron in yttrium iron garnet (YIG) single crystal films. In the case of YIG grown by LPE (liquid phase epitaxy) these substituents are added to the LPE melt from which the YIG is grown. An example of substitution is gallium which replaces iron and, thereby reduces $4\pi M$. Simultaneously, substitution of gallium reduces the lattice parameter of the YIG thereby changing the misfit stress between the YIG films and its substrate. The change in misfit stress will change $H_A$.

The present invention involves the use of lead as a substituent. Lead differs from other substituents in that it need not be added to the LPE melt since lead is already present in the PbO—$B_2O_3$ flux used to grow YIG.

The utilization of lead as a substituent in YIG films is well known. However, by growing YIG films in accordance with the low temperature technique of this invention, the incorporation of lead as a substituent for yttrium can be as much as several weight percent. It has been found, therefore, that if lead is incorporated as a substituent in the amounts of several percent, the amounts of which are determined and controlled by the growth temperature, then the lattice parameter of the YIG film is significantly altered which changes the $H_A$. In addition, incorporation of lead is accompanied by systematic variations in $4\pi M$ and in the so-called growth-induced (or lead-induced) contribution to $H_A$.

The advantages of this invention are that the LPE melt is the simplest possible, the degree of lead incorporation is easily and effectively controlled through the growth temperature, and a broad range of Pb concentrations and therefore a broad range of values of W for fixed $H_O$ can be prepared at reasonable levels of misfit when the YIG film is grown on a gadolinium gallium garnet substrate. In addition, the incorporation of lead has been found to provide beneficial effects on reducing losses for microwave devices.

In order to further illustrate the invention, the following example is presented. The example discloses a melt composition for the liquid epitaxy growth of YIG film in accordance with the technique of this invention.

EXAMPLE

| PbO | 1278.800 grams |
|---|---|
| $B_2O_3$ | 23.737 grams |
| $Fe_2O_3$ | 84.712 grams |
| $Y_2O_3$ | 5.989 grams |

The melt of the example was found to have a saturation temperature of approximately 890° C. YIG films were grown on [111] oriented $Gd_3Ga_5O_{12}$ substrate crystals at temperatures of 819.0°, 840.0°, 847.0°, 858.0°, 860.0°, 863.0°, 878.0°, 882.5° and 884.0° C. FMR (ferromagnetic resonance) fields were measured at a frequency of approximately 9.5 GHz with the applied magnetic bias field directed parallel to the film surface (parallel resonance). A systematic variation of resonance field with LPE growth temperature is shown by the data set forth in the following table. The resonance field ranged from a minimum value of 2558 Oe to a maximum value of 2601 Oe.

TABLE

| Experiment No. | Tg °C. | $H_oO_e$ |
|---|---|---|
| 1 | 860.0 | 2558 |
| 2 | 840.0 | 2571.5 |
| 3 | 878.0 | 2579.8 |
| 4 | 884.0 | 2600.7 |
| 6 | 819.0 | 2591.2 |

TABLE-continued

| Experiment No. | Tg °C. | $H_oO_e$ |
|---|---|---|
| 7 | 858.0 | 2559 |
| 8 | 847.0 | 2568 |
| 9 | 863.0 | 2560.2 |
| 16 | 882.5 | 2593 |

The data of the above table are also set forth in graphical form in the FIGURE of the drawing which shows the variation of $H_o$ (for a constant frequency of 9.5 GHz) for parallel resonance in a series of LPE YIG films grown at the temperatures referred to above. The maximum shift in $H_o$ is 43 Oe which would be equivalent to a frequency shift of 120 MHz in a constant field experiment. In the high temperature range, above 870° C., the shift appears to be due mainly to the changes in misfit stress which alters the $H_A$. At low temperatures $H_o$ increases with decreasing growth temperatures because of the growth induced contribution to $H_A$.

The YIG films were grown from the particular PbO—$B_2O_3$ flux shown in the example using a conventional isothermal liquid phase epitaxy dipping method in which a polished substrate of a gadolinium gallium garnet wafer was held horizontally and then submerged into the molten flux maintained at the appropriate temperature and then rotated about a central axis to form a single YIG film a few microns thick on the surfaces of the substrate. The film growth is carried out in a conventional vertical tube furnace with the molten flux being contained in a platinum crucible. The resulting films showed a lead concentration as great as three weight percent.

As can be seen from a consideration of the above, the present invention provides a novel means for controlling the resonance frequency of yttrium iron garnet films. Control of the resonance frequencies is achieved by being able to control the concentration of a lead substituent through the growth temperature, thus bringing about a change in the lattice parameter and subsequent control of resonance frequency in simple crystal films of yttrium iron garnet.

While the invention has been described with particularity in reference to a specific embodiment thereof, it should be understood that the disclosure of this invention is for the purpose of illustration only and is not intended to limit the invention in any way, the scope of which is defined by the appended claims.

What is claimed is:

1. A method for controlling the resonance frequency of a liquid phase epitaxy grown, single crystal, yttrium iron garnet film through the incorporation of lead as a partial substituent for the yttrium component of said film which comprises the steps of:
    (a) forming a molten flux consisting essentially of 1278.8 grams of PbO, 23.737 grams of $B_2O_3$, 84.712 grams of $Fe_2O_3$ and 5.989 grams of $Y_2O_3$;
    (b) maintaining said flux at a growth temperature of from about 819.0° to 884° centigrade while simultaneously immersing a [111] crytal oriented gadollinum gallium garnet substrate into said flux for a period of time sufficient to effect the deposition of a single crystal, lead substituted, yttrium iron garnet thin film on to the surface of said substrate such that said lead substituted component is present in an amount of up to about three weight percent; and
    (c) removing said film covered substrate from said molten flux, whereby said film is characterized by a resonance frequency ranging from a minimum value of 2558 Oe to a maximum value of 2601 Oe.

* * * * *